(12) United States Patent
Schaefer et al.

(10) Patent No.: US 9,135,982 B2
(45) Date of Patent: Sep. 15, 2015

(54) TECHNIQUES FOR ACCESSING A DYNAMIC RANDOM ACCESS MEMORY ARRAY

(71) Applicant: Intel Corporation, Santa Clara, CA (US)

(72) Inventors: Andre Schaefer, Braunschweig (DE); Jen-Chieh Yeh, Zhubei (TW); Pei-Wen Luo, Qionglin Township (TW)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/133,028

(22) Filed: Dec. 18, 2013

(65) Prior Publication Data

US 2015/0170729 A1 Jun. 18, 2015

(51) Int. Cl.
*G11C 8/00* (2006.01)
*G11C 11/408* (2006.01)
*G11C 11/4076* (2006.01)
*G11C 8/12* (2006.01)
*G11C 8/10* (2006.01)

(52) U.S. Cl.
CPC .............. *G11C 11/4087* (2013.01); *G11C 8/10* (2013.01); *G11C 8/12* (2013.01); *G11C 11/4076* (2013.01)

(58) Field of Classification Search
CPC ........ G11C 8/10; G11C 8/12; G11C 11/4087; G11C 11/4076
USPC ........... 365/230.02, 149, 194, 230.03, 230.06
See application file for complete search history.

(56) References Cited

U.S. PATENT DOCUMENTS

| | | | | |
|---|---|---|---|---|
| 5,506,810 | A | * | 4/1996 | Runas ...................... 365/230.03 |
| 5,528,552 | A | * | 6/1996 | Kamisaki .................. 365/238.5 |
| 5,761,694 | A | * | 6/1998 | Rao ................... 711/5 |
| 5,903,514 | A | * | 5/1999 | Sawada ..................... 365/233.1 |
| 5,917,770 | A | * | 6/1999 | Tanaka ..................... 365/230.03 |
| 5,963,467 | A | * | 10/1999 | Miyatake et al. ............. 365/149 |
| 5,982,696 | A | * | 11/1999 | Rao .......................... 365/230.03 |
| 2003/0081491 | A1 | * | 5/2003 | Miki ............................ 365/233 |

* cited by examiner

*Primary Examiner* — Tan T. Nguyen
(74) *Attorney, Agent, or Firm* — Kacvinsky Daisak Bluni PLLC

(57) ABSTRACT

Examples are disclosed for accessing a dynamic random access memory (DRAM) array. In some examples, sub-arrays of a DRAM bank may be capable of opening multiple pages responsive to a same column address strobe. In other examples, sub-arrays of a DRAM bank may be arranged such that input/output (IO) bits may be routed in a serialized manner over an IO wire. For these other examples, the IO wire may pass through a DRAM die including the DRAM bank and/or may couple to a memory channel or bus outside of the DRAM die. Other examples are described and claimed.

25 Claims, 8 Drawing Sheets

TECHNIQUES FOR ACCESSING A DYNAMIC RANDOM ACCESS MEMORY ARRAY

TECHNICAL FIELD

Examples described herein are generally related to memory access to dynamic random access memory.

BACKGROUND

As dynamic random access memory (DRAM) technologies are scaled to smaller dimensions and used in various operating environments and form factors relatively high levels of power usage by DRAM may require mitigation by careful design to reduce power usage. These relatively high levels become problematic in large computing systems such as data centers were even small amounts of extra power usage quickly raise costs associated with operating large data centers. Also, in small form factors such as smart phones or tablets, performance advances made in low power processors may be reduced if associated DRAM used in these devices fails to have similar advances in reducing power. For example, these small form factor devices may suffer from reduced performance if DRAM capacity is reduced to compensate for excessive power usage by DRAM.

DETAILED DESCRIPTION

As contemplated in the present disclosure, DRAM power usage may require mitigation by careful design. That careful design may factor in reducing latencies associated with read or write commands to DRAM that may enable smaller capacities of DRAM to operate more efficiently. Also, designs to more efficiently route wires that carry input/output (IO) bits to DRAM arrays may further help to reduce DRAM power usage. For example, three-dimensional (3D) chip stacking techniques may allow for a shortening or even elimination of some wires as DRAM arrays or dies may be stacked on other chips that may include processors dies, other DRAM dies or even other types of memory dies. It is with respect to these and other challenges that the examples described herein are needed.

In some examples, techniques for accessing a DRAM array may include receiving, at a DRAM bank, first and second commands to access the DRAM bank. For these examples, a first page of the DRAM bank may be opened at a first group of sub-arrays responsive to the first command and a second page of the DRAM may be opened at a second group of sub-arrays responsive to the second command. IO access to the first and second opened pages may then be enabled during a same column address strobe (CAS). As described more below, enabling IO access to both the first and second opened pages during the same CAS may reduce read/write commands included in queues and this may increase system performance.

According to some examples, techniques for accessing a DRAM array may also include receiving, at DRAM bank, a column address to fetch data for an activated page through a given column select line (COLSL) that causes IO bits to be routed via respective master data lines (MDQs) from two or more sub-arrays for the DRAM bank. For these examples, a first IO bit for the given COLSL from a first sub-array of the two or more sub-arrays may be delayed for at least one column address strobe following receipt of the given column address. Also for these examples, the first IO bit routed via a first MDQ for the first sub-array may be multiplexed with a second IO bit routed via a second MDQ for a second sub-array of the two or more sub-arrays such that the first and second IO bits are routed over a first IO wire in consecutive column address strobes in a serialized manner. As described more below, multiplexing the two IO bits may possibly reduce a number of IO wires routed from the DRAM bank. This may be particularly useful in 3D chip stacking scenarios as reduced IO wires may correspondingly reduce a number of through silicon vias (TSVs) passing through a DRAM die that may include the DRAM bank.

Figure 1:
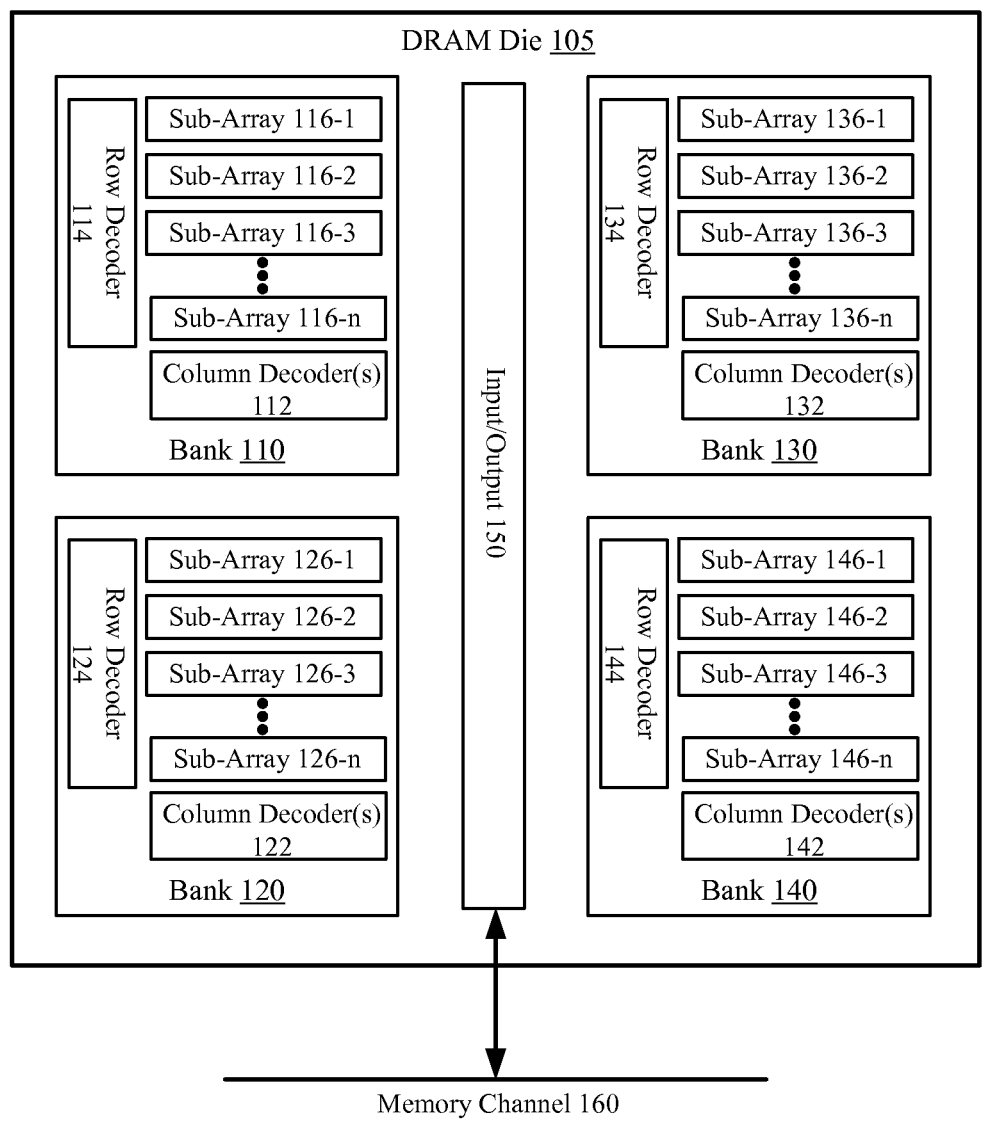
FIG. 1 illustrates an example first system.

FIG. 1 illustrates an example first system. As shown in FIG. 1, the first system includes system 100. In some examples, system 100 may include a DRAM die 105 having banks 110, 120, 130, 140 and an IO 150. As shown in FIG. 1, in some examples, IO 150 may route IO information or data to or from banks 110 to 140 and outside of DRAM die 105 to a bus or memory channel 160. Although not shown in FIG. 1, memory channel 160 may couple to a memory controller for a computing system arranged to couple with DRAM die 105.

According to some examples, as shown in FIG. 1, banks 110 to 140 each include sub-arrays that share peripheral circuitry such as row and column decoders. For example, bank 110 includes sub-arrays 116-1 to 116-*n*, where "n" is any positive whole integer greater than 3. In some examples, sub-arrays 116-1 to 116-*n* may be arranged to share row decoder 114 and column decoder(s) 112. Row decoder 114 or column decoder(s) 112 may include logic that may activate rows and/or columns of sub-arrays 116-1 to 116-*n* to read or write data to these sub-arrays, e.g., responsive to row or column address strobes and receipt of read/write commands.

In some examples, IO 150 may include circuitry to gather bits to be read from or written to sub-arrays 116-1 to 116-*n* and then route those bits to/from one or more processors (not shown) via memory channel 160. For these examples, memory channel 160 may be controlled by a memory controller (not shown) for the one or more processors. The one or more processors, for example, may be included in a computing platform, device or system that may include, but is not limited to, a computer, a personal computer (PC), a desktop computer, a laptop computer, a notebook computer, a netbook computer, an Ultrabook™ computer, a tablet computer, a tablet, a portable gaming console, a portable media player, a wearable computer, a smart phone, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof.

Figure 2:
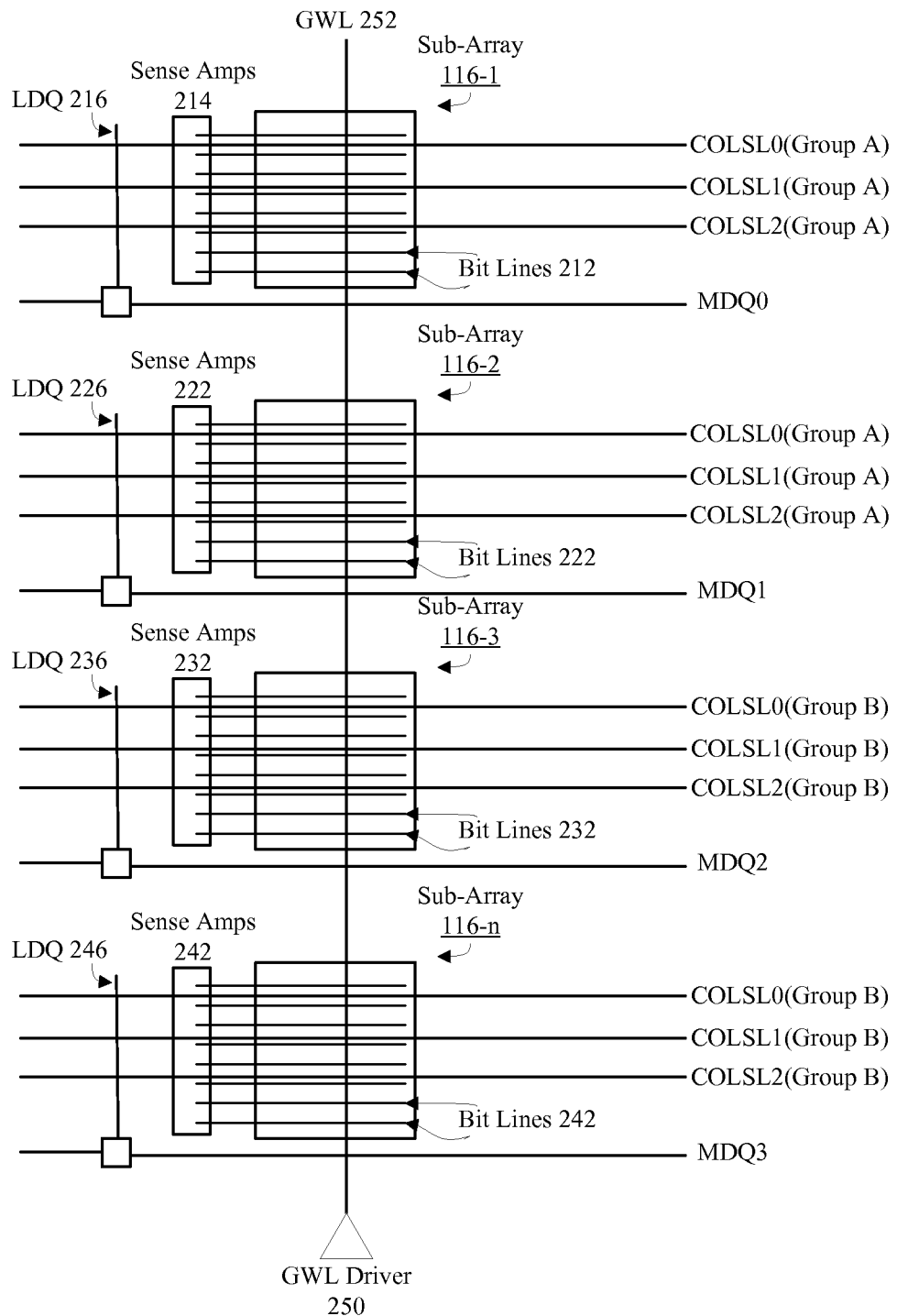
FIG. 2 illustrates an example second system.

FIG. 2 illustrates an example second system. As shown in FIG. 2, the second system includes system 200. In some examples, system 200 may depict a more detailed view of circuitry included in sub-arrays 116-1 to 116-*n* of bank 110 of system 100 shown in FIG. 1. For these examples, sub-arrays 116-1 to 166-*n* may be included in a segment strip that may be activated via various column select lines (COLSLs). These various COLSLs are shown in FIG. 2 as COLSL0 to COLSL2.

According to some examples, as shown in FIG. 2, sub-arrays 116-1 to 116-n each include a plurality of bit lines coupled to sense amplifiers (Amps). For these examples, responsive to a global word line (GWL) 252 driven by GWL driver 250 and also responsive to a given COLSL, input/output (IO) to the bits lines stored in sense amps 214, 222, 232 or 242 thru prior page activation may be connected through respective COLSL with respective local data lines (LDQs) connected to respective master data lines (MDQs). For example, sub-array 116-1 having bit lines 212 coupled to sense amps 214 may be enabled for IO via LDQ 216 coupled to MDQ0 to read or write a bit to a selected memory cell of bit lines 212 responsive to the given COLSL and GWL 252. In some examples, a sub-array may use segment word lines and its drivers as driver hierarchy below GWL 252 to select the bits along a given bit line (not shown in FIG. 2).

In some examples, as described in more detail below, an address space for a given COLSL may be split into at least two groups of sub-arrays. For example, as shown in FIG. 2, each of COLSL0 to COLSL2 are split into group A for sub-arrays 116-1 and 116-2 and group B for sub-arrays 116-2 and 116-n. A DRAM bank may include logic in a column decoder to recognize which group of sub-arrays is to open a page (e.g., activate a row) responsive to received read/write commands based on separate column addresses indicated in these commands. As a result of splitting a single COLSL between groups A and B, IO access to separate open pages in a same DRAM bank may be possible responsive to a same column address strobe (CAS). In some examples, this may allow for the DRAM bank to have an ability to nearly simultaneously service read and write commands to the two open pages.

Examples are not limited to the number of COLSLs shown in FIG. 2 or described above for system 200. Any number of COLSLs is contemplated. Also, more groups of sub-arrays to further split address spaces for COLSLs is contemplated. Examples, in the above context are therefore not limited to three COLSLs and/or two groups.

Figure 3:
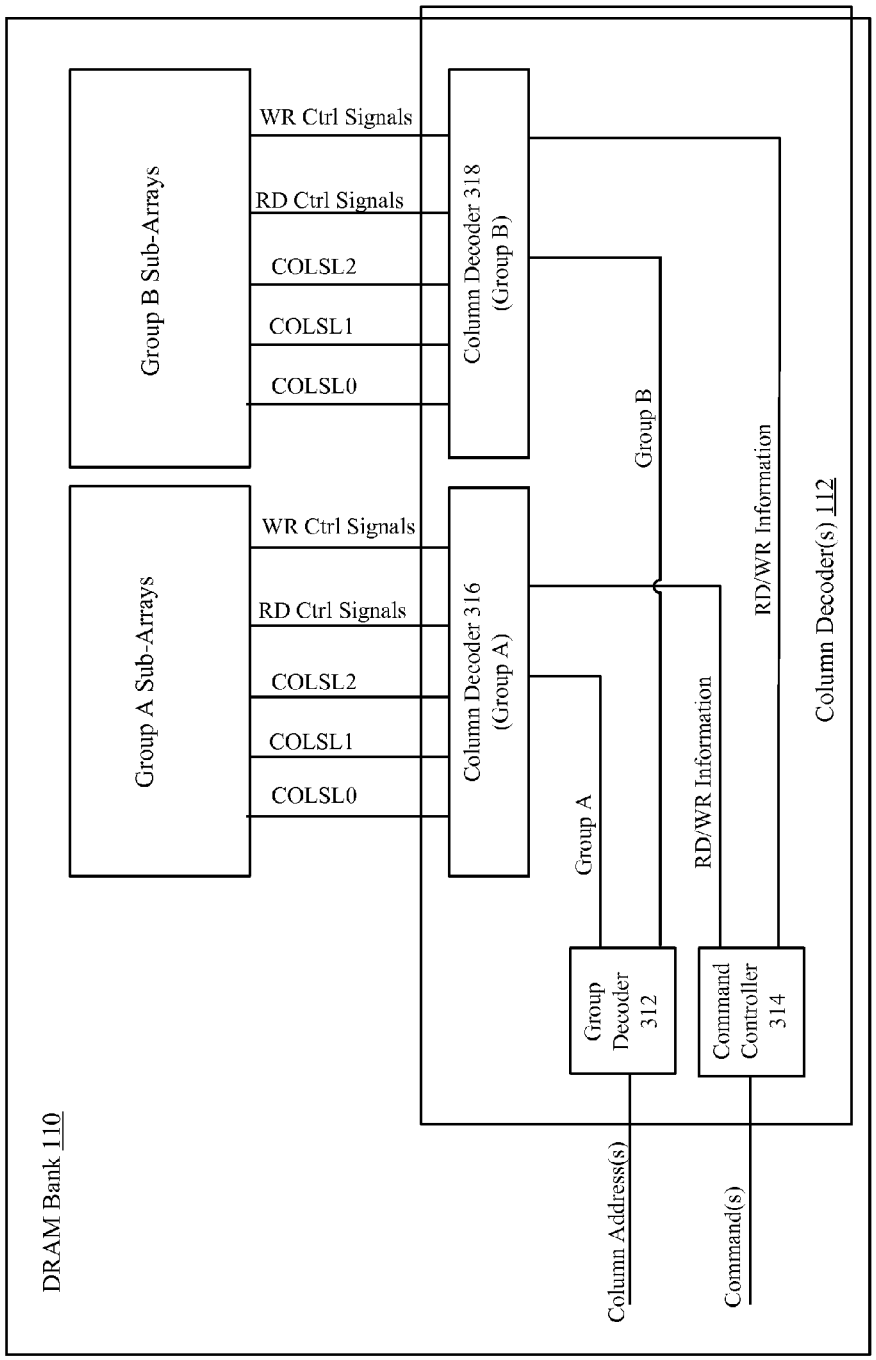
FIG. 3 illustrates an example third system.

FIG. 3 illustrates an example third system. As shown in FIG. 3, the third system includes system 300. In some examples, system 300 shows how column decoder(s) 112 of DRAM bank 110 may include logic to select groups of sub-arrays based on column addresses indicated in received commands. For example, column decoder(s) 112 is shown in FIG. 3 as including a group decoder 312 coupled to a column decoder 316 and a column decoder 318. Also, as shown in FIG. 3, a command controller 314 may couple to column decoder 316 and column decoder 318.

According to some examples, group decoder 312 may be capable of receiving one or more column addresses associated with one or more commands (e.g., from a memory controller) received by command controller 314. The one or more commands may be to access sub-arrays of DRAM bank 110 that may have been grouped into group A and group B as shown in FIG. 2. For these examples, group decoder 312 may determine which group of sub-arrays may be accessed (read from or write to) based on the one or more column addresses associated with the one or more commands. A first set of column addresses, for example, may be assigned to sub-arrays 116-1 and 116-2 included in group A and a second set of column address may be assigned to sub-arrays 116-3 and 116-n included in group B.

In some examples, a first command (e.g., a read command) having a first column address that falls within the first set of column addresses may be received by command controller 314. Group decoder 312 may identify that the first column address is part of the first set assigned to group A and may forward the first column address to column decoder 316 for group A. Also a second command may also be received substantially concurrent with the first command (e.g., a write command) having a second column address that falls within the second set of column addresses. Group decoder 312 may identify that the second column address is part of the second set assigned to group B and may forward the first address to column decoder 318 for group B.

According to some examples, command control 314 may be capable of forwarding information associated with the received first and second commands. For example, the first command may be a read command and command control 314 may forward read control signals to column decoder 316 or column decoder 318. Since column decoder 316 is handling the first column address associated with the first command, column decoder 316 will send the read control signals to the group A sub-arrays. Meanwhile column decoder 318 may ignore these forwarded read control signals. In some examples, the second command may be a write command and command control 314 may forward write control signal to column decoder 316 or column decoder 318. Since column decoder 318 is handling the second column address associated with the second command, column decoder 318 will send the write control signals to the group B sub-arrays. Meanwhile column decoder 316 may ignore these forwarded write control signals.

In some examples, given COLSLs at each of group A and group B may be asserted or activated by column decoder 316 and 318, respectively based on the received first and second column addresses. An asserted given COLSL to group A sub-arrays may cause a first page of DRAM bank 110 to be opened. Also, an asserted given COLSL to group B sub-arrays may cause a second page of DRAM bank 110 to be opened. For these examples, both first and second pages may be opened during the same CAS. Opening the first and second pages may then enable MDQs assigned to group A and B sub-arrays to allow or facilitate IO access during the same CAS. Hence, IO access associated with multiple commands may be possible at a same DRAM bank during the same CAS.

Figure 4:
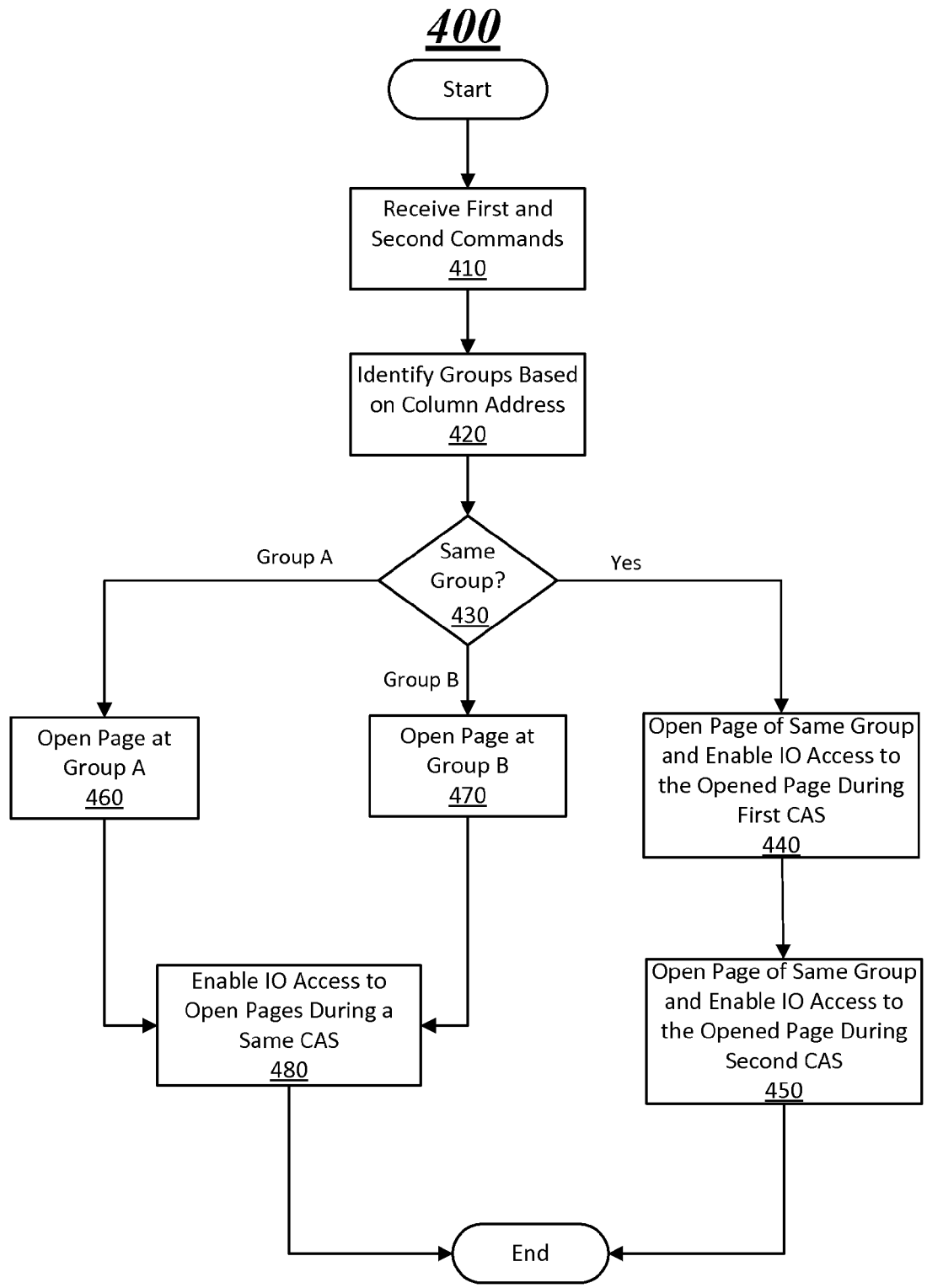
FIG. 4 illustrates an example first logic flow.

FIG. 4 illustrates an example first logic flow 400. In some examples, logic flow 400 may be implemented by elements of systems 100, 200 or 300 as described above for FIGS. 1-3. However, the example processes or operations are not limited to implementation using elements of systems 100, 200 or 300.

Moving from Start to block 410, logic flow 400 may receive first and second commands. In some examples, read/write control information for the first and second commands may be received by command controller 314 and group decoder 312 may receive the column addresses associated with the first and second commands.

Proceeding from block 410 to block 420, logic flow 400 may identify groups based on column address. According to some examples, group decoder 312 may identify which groups the first and second commands are assigned based on column address.

Proceeding from block 420 to decision block 430, logic flow 400 may determine whether the same group is indicated by column addresses associated with the first and second commands. If the column addresses are associated with the same group, the process moves to block 440. Otherwise, if column addresses are assigned to group A, the process moves to block 450. If column addresses are assigned to group B, the process moves to block 460.

Moving from decision block 430 to block 440, logic flow 400 may then open a single page of the same group assigned to the same column addresses for the first command and enable IO access to the single opened page during a first CAS. For these examples, IO access may also include enabling IO access via MDQs assigned to the same group. The IO access via these MDQs may be based on read or write control signals associated with the first command.

Proceeding from block 440 to block 450, logic flow 400 may then open another single page of the same group assigned to the same column address for the second command and enable IO access to the other opened page during a second CAS. Opening the other single page may also result in the closing of the page opened responsive to the first command. For these examples, IO access may also include enabling IO access via MDQs assigned to the same group. The IO access via these MDQs may be based on read or write control signals associated with the second command. The process may then come to an end for first and second commands received that have column addresses that are assigned to the same group of sub-arrays.

Moving from decision block 430 to block 460, logic flow 400 may open a page of group A.

Moving from decision block 430 to block 470, logic flow 400 may also open a page of group B. In some examples, opening separate pages of groups A and B may result in separate pages of a DRAM bank being opened concurrently.

Moving from blocks 460 or 470 to block 480, logic flow 400 may enable IO access to the opened pages during a same CAS. In some examples, IO access may include enabling separate IO access to MDQs separately assigned to either group A or group B. For these examples, read or write control signals associated with the first or second commands may enable the IO access to the MDQs. The process then comes to an end.

Figure 5:
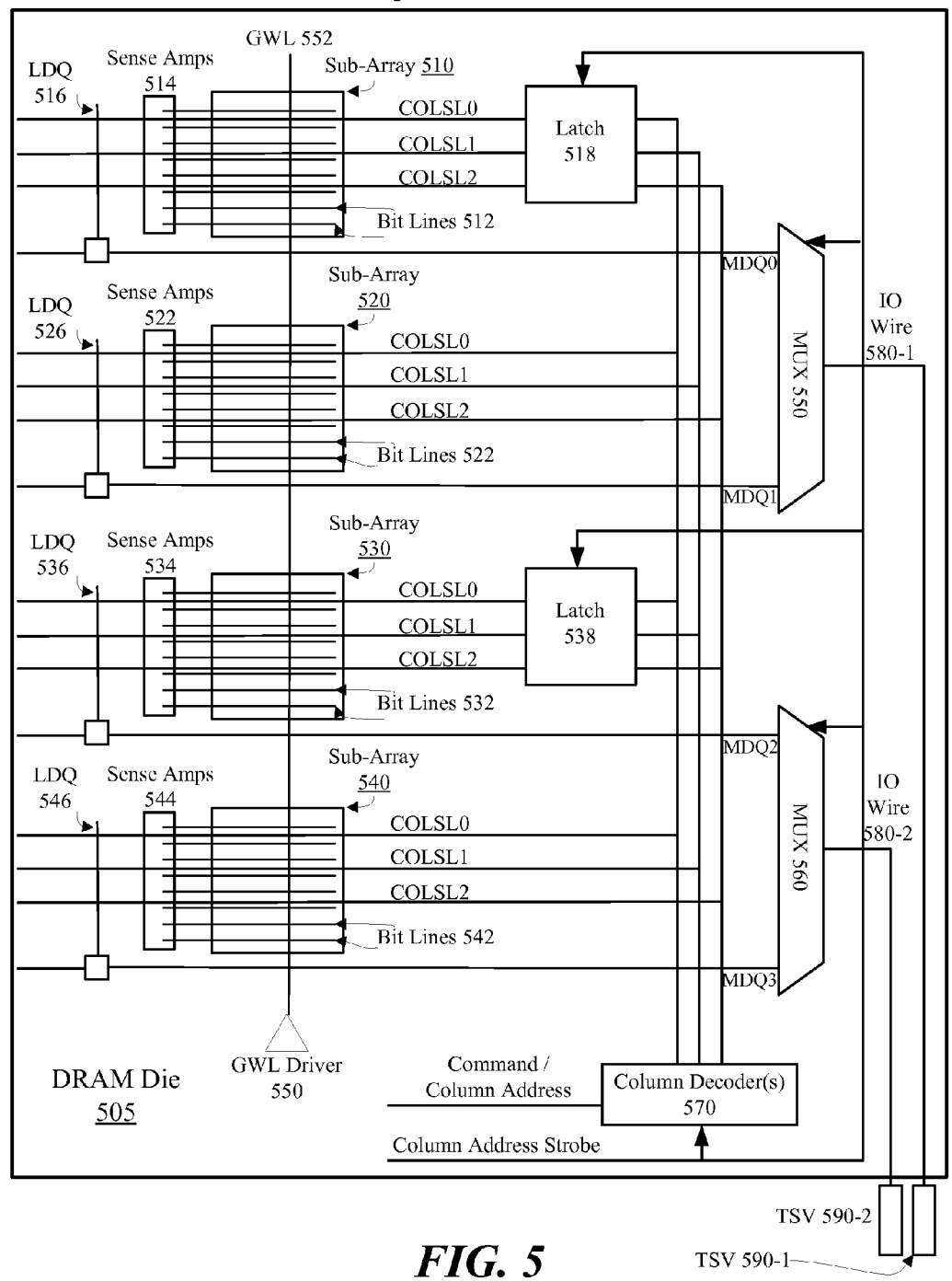
FIG. 5 illustrates an example fourth system.

FIG. 5 illustrates an example fourth system. As shown in FIG. 5, the fourth system includes system 500. In some examples, system 500 may have a similar layout as system 200 shown in FIG. 2. As shown in FIG. 5, system 500 includes a DRAM die 505. According to some examples, DRAM die 505 may include sub-arrays 510, 520, 530 and 540. Different from the layout of system 200 shown in FIG. 2, the layout for DRAM die 505 in FIG. 5 depicts latches, multiplexers (MUXs) and through silicon vias (TSVs) to route IO wires.

According to some examples, as shown in FIG. 5, a block for latching and retiming may be coupled to COLSLs for one sub-array of pairs of sub-arrays and a multiplexer (MUX) may be coupled to MDQs for each sub-array of a given pair. For example, latch 518 may couple to COLSLs for sub-array 510 and MUX 550 may couple to MDQ0 for sub-array 510 and MDQ1 for sub-array 520. Also, latch 538 may couple to COLSLs for sub-array 530 and MUX 560 may couple to MDQ2 for sub-array 530 and MDQ3 for sub-array 540.

In some examples, column decoder(s) 570 may include a command controller, a group decoder and possibly two or more group column decoders (e.g., such as column decoder 316 or 318). Also, as shown in FIG. 5, column decoder(s) 570, latches 518, 538 or MUXs 550, 560 may be responsive to or controlled by column address strobes (CASs).

According to some examples, latch 518 may be a first latch of the four sub-array layout shown in FIG. 5 that may be capable of delaying a first IO bit for a given COLSL asserted responsive to receiving a command that causes column decoder(s) 570 to assert the given COLSL based on a column address and may also cause GWL drive 550 to assert GWL 552. For these examples, the first IO bit may be delayed for at least one CAS. As a result, IO access via MDQ0 may be shifted by a time period equivalent to at least one CAS. MUX 550 coupled to MDQ1 of sub-array 520 may be capable of delaying a second bit for the given COLSL for at least two CASs after receipt of the column address. MUX 550 may then be controlled by each CAS such that the first IO bit routed via MDQ0 passes through MUX 550 responsive to a first CAS and the second IO bit routed via MDQ1 passes through MUX 550 responsive to a second CAS.

In some examples, latch 538 may be a second latch of the four sub-array layout shown in FIG. 5 that may be capable of delaying a third IO bit for the given COLSL asserted responsive to receiving the command that causes column decoder(s) 570 to assert the given COLSL based on the column address as mentioned above. For these examples, the third IO bit may also be delayed for at least one CAS. As a result, IO access via MDQ2 may also be shifted by a time period equivalent to at least one CAS. MUX 560 coupled to MDQ2 of sub-array 530 may be capable of delaying a fourth IO bit for the given COLSL for at least two CASs after receipt of the column address. MUX 560 may also be controlled by each CAS such that the third IO bit routed via MDQ2 passes through MUX 560 responsive to the first CAS and the fourth IO bit routed via MDQ2 passes through MUX 560 responsive to a second CAS.

According to some examples, IO wire 580-1 coupled to an output for MUX 550 may route the first and second IO bits outside of DRAM die 505 in the first and second CASs in a serialized manner. Also, IO wire 580-2 coupled to an output for MUX 560 may route the third and fourth IO bits outside of DRAM die 505 in the first and second CASs in the serialized manner. For these examples, as shown in FIG. 5, IO wire 580-1 may be routed through TSV 590-1 and IO wire 580-2 may be routed through TSV 590-2.

In some examples, DRAM die 505 may be included in a 3D chip stack. For these examples, TSVs 590-1 and 590-2 may couple to another chip. That coupling may be include IO wires 580-1 or 580-2 through respective TSVs 590-1 and 590-2 being capable of routing IO bits to the other chip.

Examples are not limited to the number of paired sub-arrays shown in FIG. 5, any number of pairs of sub-arrays is contemplated. Also, larger MUXs that may multiplex at a higher ratio than 2:1 may be used to allow for serialization of more than 2 bits. For example, a MUX capable of 4:1 multiplexing is contemplated.

According to some examples, although not shown in FIG. 5, sub-arrays 510, 520, 530 and 540 may be grouped in a similar manner as mentioned above for FIG. 2. Logic included in column decoder(s) 570 may then be capable of opening separate pages in the grouped sub-arrays as mentioned above for FIG. 2 or FIG. 3. The separately opened pages may then have serialized IO bits outputted from applicable MDQs as mentioned above for FIG. 5.

Figure 6:
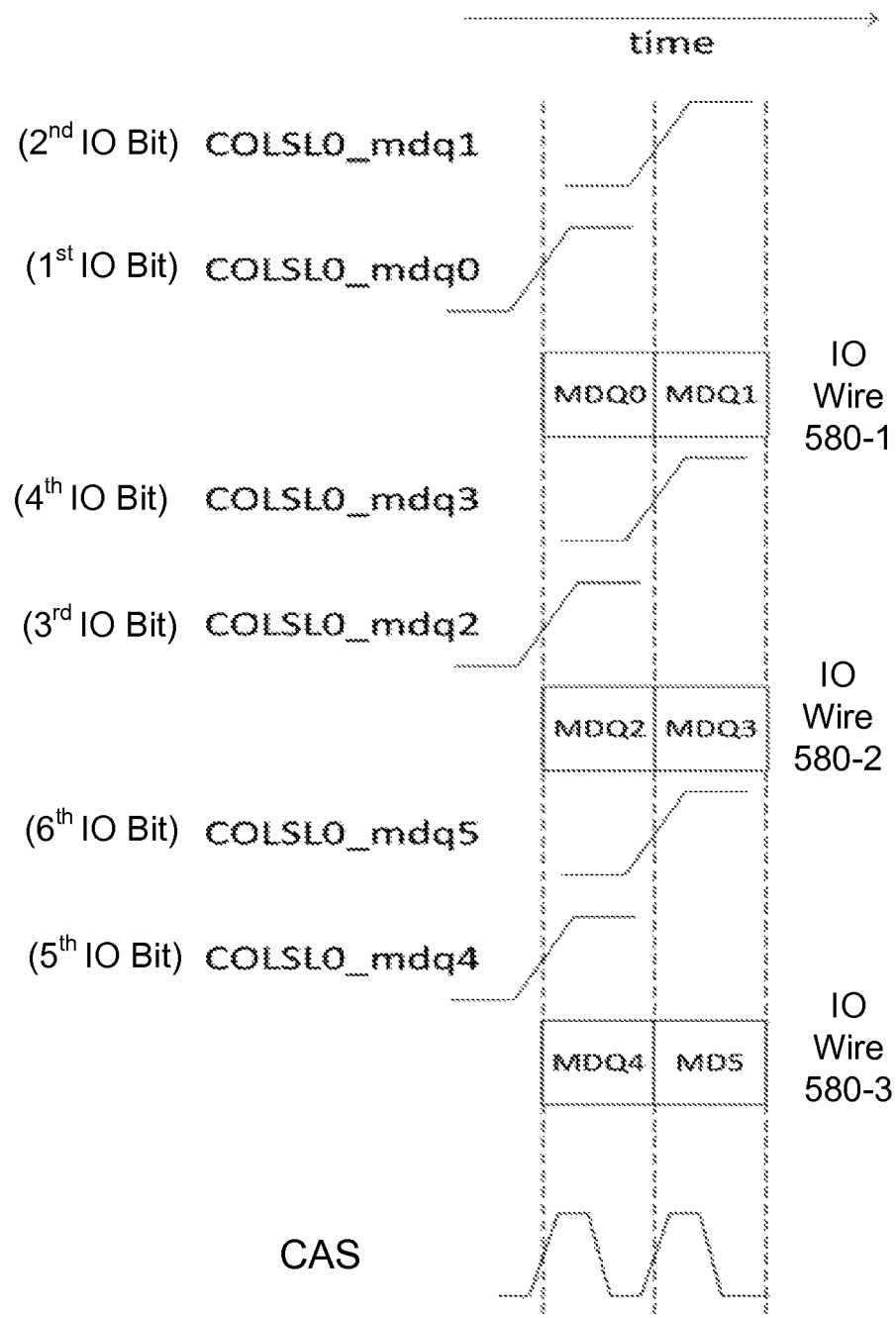
FIG. 6 illustrates an example timing.

FIG. 6 illustrates an example timing 600. In some examples, timing 600 shows how an example timing of when IO bits may be routed from MDQ0 to MDQ3 for COLSL0 of a DRAM array such as arrays 510 to 540 described for FIG. 5. Also additional bits routed from MDQs 4 and 5 are shown in FIG. 6. As shown in FIG. 6, responsive to the first CAS, IO bits for MDQ 0 (1st IO bit), MDQ2 (3rd IO bit) and MDQ 4 (5th IO bit) may be routed over respective IO wires 180-1, 180-2 and IO wire 180-m, where "m" equates to any positive integer greater than 2. Also, as shown in FIG. 6, responsive to a second CAS, IO bits for MDQ1 (2nd IO bit), MDQ3 (4th IO bit) and MDQ6 (6th IO bit) may be routed over respective IO wires 180-1, 180-2 and 180-m. As a result multiple IO bits may be outputted to IO wires in a serialized manner.

In some other examples, delays between serialized IO bits may be longer than single CASs. Therefore examples are not limited to delays of a single CAS for serialization of IO bits.

Figure 7:
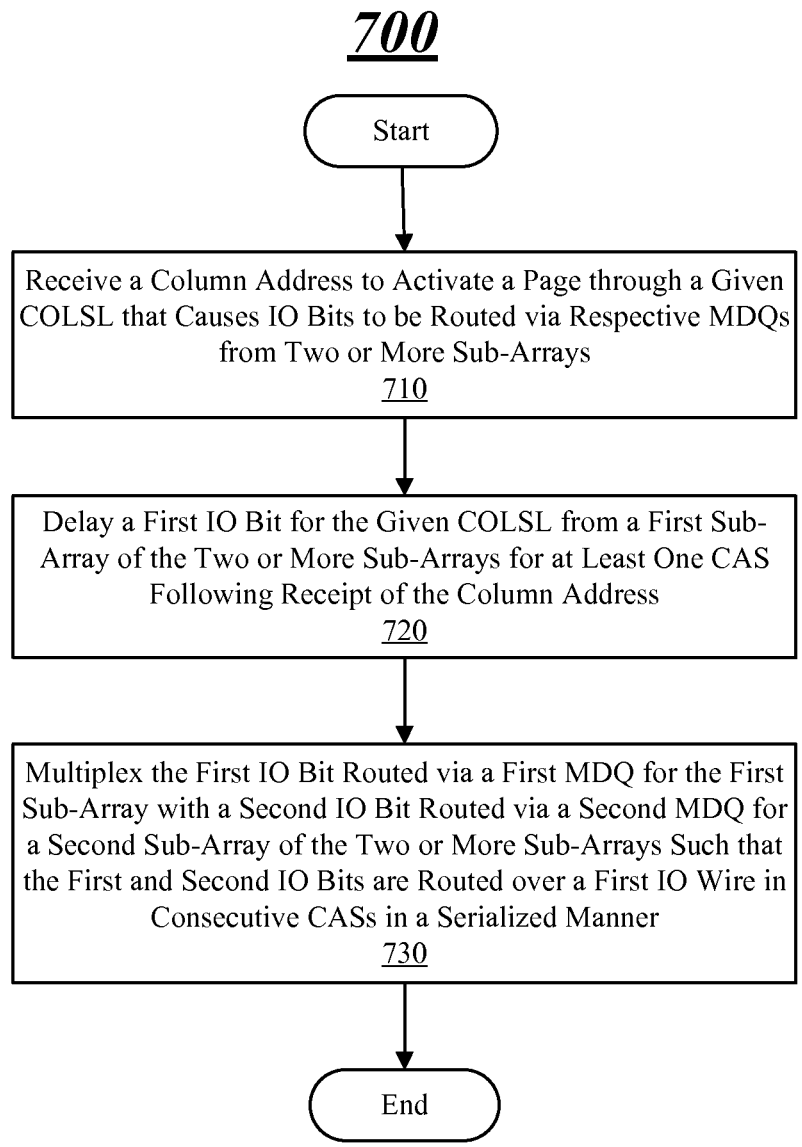
FIG. 7 illustrates an example second logic flow.

FIG. 7 illustrates an example second logic flow 700. In some examples, logic flow 700 may be implemented by elements of systems 100, 200, 300 or 500 as described above for FIGS. 1-3 and 5. However, the example processes or operations are not limited to implementation using elements of systems 100, 200, 300 or 500.

Moving from Start to block 410, logic flow 400 may receive a column address to activate a page through a given COLSL that causes IO bits to be routed via respective MDQs from two or more sub-arrays. In some examples, the column address may be associated with a command received at a column decoder (e.g. column decoder(s) 570) that may then cause the given COLSL to be asserted to activate the page.

Proceeding from block 410 to block 420, logic flow 400 may delay a first IO bit for the given COLSL from a first sub-array of the two or more sub-arrays for at least one CAS following receipt of the column address. According to some examples, the first IO bit may be delayed via use of a latch (e.g., latch 518).

Proceeding from block 420 to block 430, logic flow 400 may multiplex the first IO bit routed via a first MDQ for the first sub-array with a second IO bit routed via a second MDQ for a second sub-array of the two or more sub-arrays such that the first and second IO bits are routed over a first IO wire in consecutive CASs in a serialized manner. In some examples, a MUX (e.g., MUX 550) coupled to the first and second MDQs may be utilized to delay the second IO bit so that the first IO bit is outputted from the MUX with a first CAS and the second IO bit is outputted with a second, consecutive CAS. The process then comes to an end.

Figure 8:
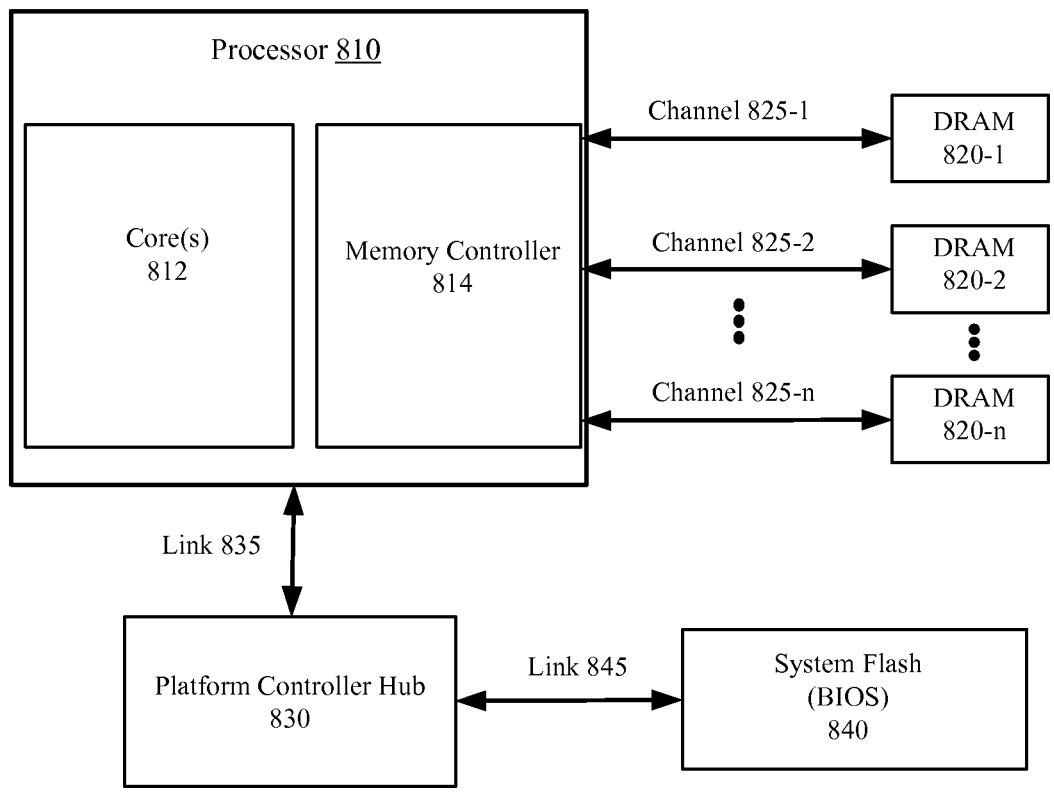
FIG. 8 illustrates an example fifth system.

FIG. 8 illustrates an example fourth system. As shown in FIG. 8, the fourth system includes system 800. In some examples, system 800 may include a processor 810, a platform controller hub 830, a system flash 840 or DRAMs 820-1 to 820-$n$, where "n" is any positive whole integer greater than 2. Also, as shown in FIG. 8, DRAMs 820-1 to 820-$n$ may couple to processor 810 via respective channels 825-1 to 825-$n$.

According to some examples, as shown in FIG. 8, processor 810 may include core(s) 812 and a memory controller 814. For these examples, memory controller 814 may include logic and/or features to serve as an integrated memory controller for processor 810. As the integrated memory controller for processor 810, memory controller 814 may facilitate read or write access to DRAMs 820-1 to 820-$n$ for elements of processor 810 such as core(s) 812.

In some examples, system flash 840 may be capable of storing a basic input output system (BIOS). For these examples, during system boot of system 800, the BIOS may be forwarded via communication link 845 to platform controller hub 830 and then to core(s) 812 via link 835. The BIOS may include software instructions to be executed by core(s) 812 as at least a part of the system boot.

According to some examples, DRAMs 820-1 to 820-$n$ may or may not be on separate dual in-line memory modules (DIMMs) each having a plurality of DRAM chips. The DIMMs may include various types of DRAM such as double data rate synchronous DRAM (DDR SDRAM) as described in one or more technical standards or specifications to include those published by the JEDEC Solid State Technology Association ("JEDEC") for various generations of DDR such as DDR2, DDR3, DDR4 or future DDR generations. For example, JESD79-3F—"DDR3 SDRAM Standard", published in July 2012 and/or later revisions. The DIMMs may be arranged in various configurations to include, but are not limited to, register DIMMs (RDIMMs), load reduced DIMMs (LRDIMMs), unregistered DIMMs (UDIMMs) or fully buffered DIMMs (FB-DIMMs). These various configurations may also be described in one or more technical standards published by JEDEC.

In some examples, DRAMs 820-1 to 820-$n$ may include DRAM arrays arranged as described above for systems 200 or 500 and shown in FIGS. 2 and 5.

In some examples, system 800 may be part of a system or device that may be, for example, user equipment, a computer, a personal computer (PC), a desktop computer, a laptop computer, a notebook computer, a netbook computer, a tablet computer, a tablet, a portable gaming console, a portable media player, a smart phone, wearable computer, Ultrabook computer, a server, a server array or server farm, a web server, a network server, an Internet server, a work station, a minicomputer, a main frame computer, a supercomputer, a network appliance, a web appliance, a distributed computing system, multiprocessor systems, processor-based systems, or combination thereof. Accordingly, functions and/or specific configurations of a device including system 800 described herein, may be included or omitted in various examples, as suitably desired.

It should be appreciated that example system 800 shown in the block diagram of FIG. 8 may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in other examples.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, controllers, decoders, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

In some examples, an example first apparatus may include a DRAM bank that includes a first group of sub-arrays and a second group of sub-arrays and a group decoder to receive column addresses associated with commands to access the DRAM bank and determine which group of sub-arrays is to be accessed based on the column addresses. The first apparatus also including a first column address decoder coupled to the first group of sub-arrays. The first column address decoder capable of opening a first page of the DRAM bank responsive to a first command received by the group decoder that has first column addresses assigned to the first group and responsive to a given CAS. The first apparatus also including a second column address decoder coupled to the second group of sub-arrays. The second column address decoder may be capable of opening a second page of the DRAM bank responsive to a second command received by the group decoder that has second column addresses assigned to the second group and responsive to the given CAS.

According to some examples for the first apparatus, the DRAM bank may include MDQs arranged so that first and second portions of the MDQs are respectively assigned to the first and second groups of sub-arrays. The first and second portions may be capable of IO access to the first and second opened pages during the given CAS.

In some examples, the first apparatus may also include a command controller to forward information associated with the first and second commands to the first and second decoders to provide read or write access to the first and second opened pages during the given CAS.

According to some examples for the first apparatus, the first command may be a read command and the second command is a write command.

In some examples for the first apparatus, the DRAM bank may be DDR DRAM that includes DDR3 DRAM or DDR4 DRAM.

In some examples for the first apparatus, the DRAM bank may be located on a DRAM die included in a 3D chip stack.

In some examples, an example first method may include receiving, at a DRAM bank, first and second commands to access the DRAM bank and opening a first page of the DRAM bank at a first group of sub-arrays responsive to the first command. The first methods may also include opening a second page of the DRAM bank at a second group of sub-arrays responsive to the second command and enabling IO access to the first and second opened pages during a same CAS.

According to some examples, the first method may also include determining to open the first page responsive to the first command based on a first column address indicated in the first command that is assigned to the first group of sub-arrays. The first method may also include determining to open the second page responsive to the second command based on a second column address indicated in the second command that is assigned to the second group of sub-arrays.

In some examples for the first method, the DRAM bank may include MDQs arranged so that first and second portions of the MDQs are respectively assigned to the first and second groups of sub-arrays. For these examples, the first and second portions may be capable of IO access to the first and second opened pages during the given CAS.

According to some examples for the first method, the first command may be a read command and the second command is a write command.

In some examples, an apparatus may include means for performing the above first method.

In some examples, an example second apparatus may include a DRAM array having at least two sub-arrays, each sub-array having an MDQ capable of IO for a given COLSL from each of the plurality of sub-arrays. The second apparatus may also include a first latch coupled to the given COLSL for a first sub-array of the at least two sub-arrays. The first latch may delay a first IO bit for the given COLSL from the first sub-array for at least one column address strobe responsive to receipt of a column address for the given COLSL. The first apparatus may also include a first MUX coupled to a first MDQ for the first sub-array and a second MDQ for a second sub-array of the at least two sub-arrays. The first MUX may be capable of delaying a second IO bit for the given COLSL for at least two column address strobes after receipt of the column address for the given COLSL. The first MUX may be controlled by each column address strobe such that the first IO bit routed via the first MDQ passes through the first MUX responsive to a first column address strobe and the second IO bit routed via the second MDQ passes through the first MUX responsive to a second column address strobe.

According to some examples, the second apparatus may also include a first IO wire coupled to the output of the first MUX to route the first and second IO bits outside of a DRAM die including the DRAM array in the first and second column address strobes in a serialized manner.

In some examples for the second apparatus, the DRAM die may be included in a 3D chip stack. For these examples, the first IO wire may be routed through a first TSV in the DRAM die to another chip in the 3D chip stack.

According to some examples for the second apparatus, the first latch may be controlled by each column address strobe.

In some examples for the second apparatus, the DRAM array may be a DRAM bank having first and second groups of sub-arrays. For these examples, the first and second sub-arrays may be included in the first group and third and fourth sub-arrays may be included in the second group.

According to some examples, the second apparatus may also include a second latch coupled to the given COLSL for the third sub-array. The second latch may delay a third IO bit for the given COLSL from the third sub-array for at least one column address strobe responsive to receipt of the column address for the given COLSL. The second apparatus may also include a second MUX coupled to a third MDQ for the third sub-array and a fourth MDQ for the fourth sub-array. The second MUX may be capable of delaying a fourth IO bit for the given COLSL for at least two column address strobes after receipt of the column address for the given COLSL. The second MUX may be controlled by each column address strobe such that the third IO bit routed via the third MDQ passes through the second MUX responsive to the first column address strobe and the fourth IO bit routed via the fourth MDQ passes through the second MUX responsive to the second column address strobe.

In some examples, the second apparatus may also include a first IO wire coupled to the output of the first MUX to route the first and second IO bits outside of a DRAM die including the DRAM array in the first and second column address strobes in a serialized manner. The second apparatus may also include a second IO wire coupled to the output of the second MUX to route the third and fourth IO bits outside the DRAM die including the DRAM array in the first and second column address strobes in the serialized manner.

According to some examples for the second apparatus, the DRAM die may be included in a 3D chip stack. For these examples, the first IO wire may be routed through a first TSV in the DRAM die to another chip in the 3D chip stack. The second IO wire may route the third and fourth IO bits through a second TSV in the DRAM die to the other chip.

In some examples, the second apparatus may also include a group decoder to receive commands to access the DRAM bank and determine which group of sub-arrays is to be accessed based on column addresses indicated in received commands. The second apparatus may also include a first column address decoder coupled to the first group of sub-arrays. The first column address decoder may be capable of opening a first page of the DRAM bank responsive to a first command received by the group decoder that has first column addresses assigned to the first group and responsive to the given column address strobe. The second apparatus may also include a second column address decoder coupled to the second group of sub-arrays. The second column address decoder may be capable of opening a second page of the DRAM bank responsive to a second command received by the group decoder that has second column addresses assigned to the second group and responsive to the given column address strobe. The second apparatus may also include a command controller that may forward information associated with the first and second commands to the first and second decoders to provide read or write access to the first and second opened pages during the given column address strobe.

In some examples, an example second method may include receiving, at a DRAM bank, a column address to activate a page through a given COLSL that causes IO bits to be routed via respective MDQs from two or more sub-arrays for the DRAM bank. The second methods may also include delaying a first IO bit for the given COLSL from a first sub-array of the two or more sub-arrays for at least one column address strobe following receipt of the column address. The second methods may also include multiplexing the first IO bit routed via a first MDQ for the first sub-array with a second IO bit routed via a second MDQ for a second sub-array of the two or more sub-arrays such that the first and second IO bits are routed over a first IO wire in consecutive column address strobes in a serialized manner.

According to some examples for the second method, the DRAM bank may be located on a DRAM die. For these examples, the first IO wire may route the first and second IO bits to a data bus coupled to the DRAM die.

In some examples for the second method, the DRAM bank may be located on a DRAM die included in a 3D chip stack. The first IO wire may route the first and second IO bits through a first TSV in the DRAM die to another chip included in the 3D chip stack.

According to some examples for the second method, the DRAM bank may have first and second groups of sub-arrays. For these examples, the first and second sub-arrays may be included in the first group and third and fourth sub-arrays included in the second group.

In some examples, the second method may also include delaying a third IO bit for the given COLSL from the third sub-array for at least one column address strobe following receipt of the column address. The second methods may also include multiplexing the third IO bit routed via a third MDQ for the third sub-array with a fourth IO bit routed via a fourth MDQ for the fourth sub-array such that the third and fourth IO bits are routed over a second IO wire in the consecutive column address strobes in the serialized manner.

According to some examples for the second method, the DRAM bank may be located on a DRAM die included in a 3D chip stack. For these examples, the first IO wire may route the first and second IO bits through a first TSV in the DRAM die to another chip included in the 3D chip stack. Also, the second IO wire may route the third and fourth IO bits through a second TSV in the DRAM die to the other chip.

In some examples, an apparatus may include means for performing the second method as described above.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus comprising:
   a dynamic random access memory (DRAM) bank that includes a first group of sub-arrays and a second group of sub-arrays;
   a group decoder to receive column addresses associated with commands to access the DRAM bank and determine which group of sub-arrays is to be accessed based on the column addresses;
   a first column address decoder coupled to the first group of sub-arrays, the first column address decoder to open a first page of the DRAM bank responsive to a first command received by the group decoder that has first column addresses assigned to the first group and responsive to a given column address strobe (CAS); and
   a second column address decoder coupled to the second group of sub-arrays, the second column address decoder to open a second page of the DRAM bank responsive to a second command received by the group decoder that has second column addresses assigned to the second group and responsive to the given CAS.

2. The apparatus of claim 1, comprising the DRAM bank including master data lines (MDQs) arranged so that first and second portions of the MDQs are respectively assigned to the first and second groups of sub-arrays, the first and second portions capable of input/output access to the first and second opened pages during the given CAS.

3. The apparatus of claim 1, comprising:
   a command controller to forward information associated with the first and second commands to the first and second decoders to provide read or write access to the first and second opened pages during the given CAS.

4. The apparatus of claim 1, comprising the first command is a read command and the second command is a write command.

5. The apparatus of claim 1, the DRAM bank comprising double data rate (DDR) DRAM that includes DDR3 DRAM or DDR4 DRAM.

6. The apparatus of claim 1, comprising the DRAM bank located on a DRAM die included in a three-dimensional (3D) chip stack.

7. A method comprising:
   receiving, at a dynamic random access memory (DRAM) bank, first and second commands to access the DRAM bank;
   opening a first page of the DRAM bank at a first group of sub-arrays responsive to the first command;
   opening a second page of the DRAM bank at a second group of sub-arrays responsive to the second command; and
   enabling input/output access to the first and second opened pages during a same column address strobe (CAS).

8. The method of claim 7, comprising:
   determining to open the first page responsive to the first command based on a first column address indicated in the first command that is assigned to the first group of sub-arrays; and
   determining to open the second page responsive to the second command based on a second column address indicated in the second command that is assigned to the second group of sub-arrays.

9. The method of claim 8, comprising the DRAM bank including master data lines (MDQs) arranged so that first and second portions of the MDQs are respectively assigned to the first and second groups of sub-arrays, the first and second portions capable of input/output access to the first and second opened pages during the given CAS.

10. The method of claim 9, comprising the first command is a read command and the second command is a write command.

11. An apparatus comprising:
    a dynamic random access memory (DRAM) array having at least two sub-arrays, each sub-array having a master data line (MDQ) capable of input/output (IO) for a given column select line (COLSL) from each of the plurality of sub-arrays;
    a first latch coupled to the given COLSL for a first sub-array of the at least two sub-arrays, the first latch to delay a first IO bit for the given COLSL from the first sub-array for at least one column address strobe responsive to receipt of a column address for the given COLSL; and
    a first multiplexer (MUX) coupled to a first MDQ for the first sub-array and a second MDQ for a second sub-array of the at least two sub-arrays, the first MUX to delay a second IO bit for the given COLSL for at least two column address strobes after receipt of the column address for the given COLSL, the first MUX controlled by each column address strobe such that the first IO bit routed via the first MDQ to pass through the first MUX responsive to a first column address strobe and the second IO bit routed via the second MDQ to pass through the first MUX responsive to a second column address strobe.

12. The apparatus of claim 11, comprising;
    a first IO wire coupled to the output of the first MUX to route the first and second IO bits outside of a DRAM die including the DRAM array in the first and second column address strobes in a serialized manner.

13. The apparatus of claim 12, comprising the DRAM die included in a three-dimensional (3D) chip stack, the first IO wire routed through a first through silicon via (TSV) in the DRAM die to another chip in the 3D chip stack.

14. The apparatus of claim 11, comprising the first latch to be controlled by each column address strobe.

15. The apparatus of claim 11, the DRAM array comprising a DRAM bank having first and second groups of sub-arrays, the first and second sub-arrays included in the first group and third and fourth sub-arrays included in the second group.

16. The apparatus of claim 15, comprising:
    a second latch coupled to the given COLSL for the third sub-array, the second latch to delay a third IO bit for the given COLSL from the third sub-array for at least one column address strobe responsive to receipt of the column address for the given COLSL; and
    a second MUX coupled to a third MDQ for the third sub-array and a fourth MDQ for the fourth sub-array, the second MUX to delay a fourth IO bit for the given COLSL for at least two column address strobes after receipt of the column address for the given COLSL, the second MUX controlled by each column address strobe such that the third IO bit routed via the third MDQ to pass through the second MUX responsive to the first column address strobe and the fourth IO bit routed via the fourth MDQ to pass through the second MUX responsive to the second column address strobe.

17. The apparatus of claim 16, comprising;
a first IO wire coupled to the output of the first MUX to route the first and second IO bits outside of a DRAM die including the DRAM array in the first and second column address strobes in a serialized manner; and
a second IO wire coupled to the output of the second MUX to route the third and fourth IO bits outside the DRAM die including the DRAM array in the first and second column address strobes in the serialized manner.

18. The apparatus of claim 17, comprising the DRAM die included in a three-dimensional (3D) chip stack, the first IO wire routed through a first through silicon via (TSV) in the DRAM die to another chip in the 3D chip stack, the second IO wire to route the third and fourth IO bits through a second TSV in the DRAM die to the other chip.

19. The apparatus of claim 15, comprising:
a group decoder to receive commands to access the DRAM bank and determine which group of sub-arrays is to be accessed based on column addresses indicated in received commands;
a first column address decoder coupled to the first group of sub-arrays, the first column address decoder to open a first page of the DRAM bank responsive to a first command received by the group decoder that has first column addresses assigned to the first group and responsive to the given column address strobe;
a second column address decoder coupled to the second group of sub-arrays, the second column address decoder to open a second page of the DRAM bank responsive to a second command received by the group decoder that has second column addresses assigned to the second group and responsive to the given column address strobe; and
a command controller to forward information associated with the first and second commands to the first and second decoders to provide read or write access to the first and second opened pages during the given column address strobe.

20. A method comprising:
receiving, at a dynamic random access memory (DRAM) bank, a column address to activate a page through a given column select line (COLSL) that causes input/output (IO) bits to be routed via respective master data lines (MDQs) from two or more sub-arrays for the DRAM bank;
delaying a first IO bit for the given COLSL from a first sub-array of the two or more sub-arrays for at least one column address strobe following receipt of the column address; and
multiplexing the first IO bit routed via a first MDQ for the first sub-array with a second IO bit routed via a second MDQ for a second sub-array of the two or more sub-arrays such that the first and second IO bits are routed over a first IO wire in consecutive column address strobes in a serialized manner.

21. The method of claim 20, comprising the DRAM bank located on a DRAM die, the first IO wire to route the first and second IO bits to a data bus coupled to the DRAM die.

22. The method of claim 20, comprising the DRAM bank located on a DRAM die included in a three-dimensional (3D) chip stack, the first IO wire to route the first and second IO bits through a first through silicon via (TSV) in the DRAM die to another chip included in the 3D chip stack.

23. The method of claim 22, comprising:
delaying a third IO bit for the given COLSL from the third sub-array for at least one column address strobe following receipt of the column address; and
multiplexing the third IO bit routed via a third MDQ for the third sub-array with a fourth IO bit routed via a fourth MDQ for the fourth sub-array such that the third and fourth IO bits are routed over a second IO wire in the consecutive column address strobes in the serialized manner.

24. The method of claim 23, comprising the DRAM bank located on a DRAM die included in a three-dimensional (3D) chip stack, the first IO wire to route the first and second IO bits through a first through silicon via (TSV) in the DRAM die to another chip included in the 3D chip stack, the second IO wire to route the third and fourth IO bits through a second TSV in the DRAM die to the other chip.

25. The method of claim 20, comprising the DRAM bank having first and second groups of sub-arrays, the first and second sub-arrays included in the first group and third and fourth sub-arrays included in the second group.

* * * * *